United States Patent [19]

Maijers et al.

[11] Patent Number: 4,546,209
[45] Date of Patent: Oct. 8, 1985

[54] ELECTRICAL COMPONENT COMPRISING AN ELECTRIC CIRCUIT ELEMENT HAVING LEADS WHICH ARE CENTERED WITH RESPECT TO THE WALLS OF A HOUSING

[75] Inventors: Andries C. Maijers; Jan Vos, both of Eindhoven, Netherlands

[73] Assignee: U.S. Philips Corporation, New York, N.Y.

[21] Appl. No.: 589,242

[22] Filed: Mar. 13, 1984

[30] Foreign Application Priority Data

Mar. 24, 1983 [NL] Netherlands ............ 8301046

[51] Int. Cl.⁴ ............................................. H01G 1/035
[52] U.S. Cl. ................. 174/52 PE; 29/25.42; 29/856; 361/306; 361/419
[58] Field of Search ............ 29/22.42, 25.42, 855, 29/856; 174/52 PE; 264/275, 277; 338/256, 257, 275; 361/272, 306, 386, 387, 392, 394, 417, 419; 336/96

[56] References Cited

U.S. PATENT DOCUMENTS 2,606,215  8/1952  Lamb ........................ 174/52 PE
2,885,522  5/1959  Major et al. .................. 338/257
3,250,969  5/1966  Fanning ...................... 29/25.42
3,440,589  4/1969  Minks ........................ 174/52 PE
3,831,070  8/1974  Bouille et al. ................. 361/272
3,876,926  4/1975  Schott et al. .................. 361/387
4,114,008  9/1978  Luetzow ...................... 29/856
4,317,158  2/1982  Dequasie ..................... 361/272

FOREIGN PATENT DOCUMENTS 2802688  7/1979  Fed. Rep. of Germany ...... 361/306
0567588  2/1945  United Kingdom ............. 361/272

Primary Examiner—A. D. Pellinen
Assistant Examiner—Gregory D. Thompson
Attorney, Agent, or Firm—Norman N. Spain

[57] ABSTRACT

An electrical component with an electric circuit element having two mutually parallel external leads which are directed parallel to the end faces of the circuit element which element is secured in a housing which is open on one side by an electrically insulating material, having the particularity that two pairs of resilient clamping members extend from side walls of the housing. The resilient clamping members of each respective pair converge inwardly and clamp a respective external lead of the circuit element in such a position that the leads are centered with respect to the walls of the housing.

4 Claims, 3 Drawing Figures

ELECTRICAL COMPONENT COMPRISING AN ELECTRIC CIRCUIT ELEMENT HAVING LEADS WHICH ARE CENTERED WITH RESPECT TO THE WALLS OF A HOUSING

BACKGROUND OF THE INVENTION

Field of the Invention

The invention relates to an electrical component comprising an electric circuit element encapsulated in an electrically insulating material which secures the circuit element in a housing which is open on one side, said circuit element having two external mutually parallel leads which are parallel to the end faces of the circuit element.

Description of the Prior Art

Electric circuit elements in the meaning of the invention are in the first instance electrical capacitors in the form of round or flat turns or multilayer capacitor chips. The latter are of the type in which the dielectric layers are stacked alternately with metal layers, alternate metal layers extending to opposite sides of the chip, and in which the opposite end faces of the chip are metallized and connected to leads (wires). The leads in all these components are directed radially away from the components (radial wiring) so that they can be accommodated in a cup-shaped housing having in particular a rectangular cross-section. Other circuit elements are, for example, ceramic capacitors, electrical resistors, coils and semiconductor components.

In components as mentioned above in which the circuit elements are incorporated in a housing (mostly formed from an electrically insulating material like a synthetic resin), it must be ensured that the leads are positioned symmetrically with respect to an axial and radial center line. Deviations from this position are at the expense of the required assembly space on a printed circuit board. Since the leads of, for example, a foil capacitor are welded to the end faces of the capacitor cell, both the cell length and the depth of penetration of the wires contribute to tolerances of the spacing between the wires in the longitudinal direction. The wire position with respect to the thickness of the cell is determined by geometrical welding tolerances. Moreover, the thickness of the capacitor cells varies as a function of their capacitance value. This means that in practice it is difficult to position the leads of a cell symmetrically with respect to the cell. Even if this should be successful, one would also have to succeed during assembly to position the leads symmetrically with respect to the circumference of the housing. Generally, assembly takes place by embedding the circuit element in question in a moulding mass, for example an epoxy resin, and then letting the moulding mass cure to secure the element to the housing. Since the moulding mass, prior to and during curing, traverses a low viscosity phase, the possibility exists that the circuit element, if it is not fixed in the housing, changes its position in the housing before the moulding mass has solidified. For example, the circuit element may start floating in the moulding mass or may assume an oblique position under the influence of transport accelerations. If this happens, the leads are not arranged symmetrically with respect to the two pairs of opposite walls of the housing. As already said, deviations from this arrangement are at the expense of the required assembly space on a printed circuit board.

In order to tackle the above problems, two courses have so far been adopted.
1. The circuit element is centered with respect to the housing. The disadvantage of this is that tolerances of the location of the wires with respect to the cell are found again in the location of the wires with respect to the housing (see, for example, DGM 1 911 606).
2. The wires are centered with respect to the housing. So far known solutions of this type have the disadvantage that adaptation of the wire configuration is necessary to make the positioning device at the housing accessible, while as a result of tolerances undefined space remains (see, for example, DE-OS No. 2 048 454.)

SUMMARY OF THE INVENTION

It is the object of the invention to provide an electrical component comprising an electric circuit element of which the leads are positioned in the desired manner with respect to the housing without this involving the disadvantages of the known solutions.

For that purpose, an electrical component of the type described in the opening paragragh is characterized according to the invention in that two pairs of resilient clamping members extend from inside walls of the housing, the resilient clamping members of each respective pair converging towards the circuit element and clamping a respective external lead of the circuit element between the ends of the resilient clamping members of that respective pair. The advantages of this construction in which the leads are centered with respect to the two pair, of opposite housing walls are that tolerances in the wire spacing are compensated by the resilient clamping members while no adaptation of the wire configuration is necessary for centering. The component according to the invention hence is optimally suitable for (automatic) assembly on a printed circuit board: the required assembly space is minimum.

According to a preferred embodiment the system is self-locating in that the resilient clamping members of each pair have profiles which have a centering effect.

BRIEF DESCRIPTION OF THE DRAWINGS

Two embodiments of the invention will now be described in greater detail with reference to the drawing, in which.

DESCRIPTION OF THE PREFERRED EMBODIMENT

Figure 1:
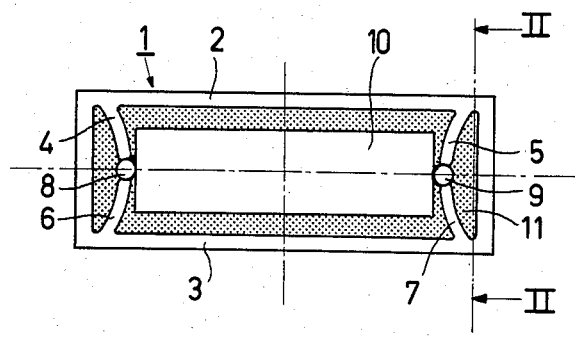
FIG. 1 is a plan view of a first component comprising a housing containing a capacitor cell.
Figure 2:
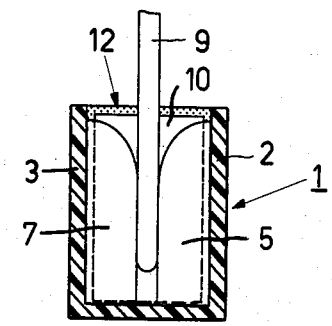
FIG. 2 is an elevation of a cross-sectional view taken on the line II—II in FIG. 1.

As shown in FIGS. 1 and 2, a rectangular housing 1 of a synthetic resin in which housing two pairs of resilient clamping members 4, 5 and 6, 7 extend from opposite longitudinal walls 2 and 3 of the housing 1 are pairwise opposite to each other. The resilient clamping members 4 and 5 which extend from the wall 2, converge inwardly and so do the resilient clamping members 6 and 7 which extend from the wall 3. The resilient clamping members ensure the two-sided centering of the connection wires 8 and 9 of a capacitor cell 10 which is placed in the housing 1. The cell 10 is embedded in a synthetic resin moulding mass 11 and secured thereby to the housing 1. The resilient clamping members 4, 5, 6 and 7 are resilient so that compensation can be made for variations in the length of the cell 10. Moreover the resilient clamping members ensure that the cell 10 during moulding and optional transport is clamped in the housing 1 so that its position in the housing 1 cannot change.

Figure 3:
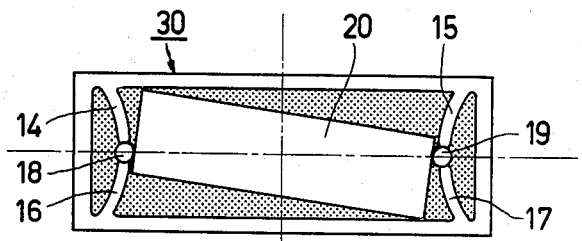
FIG. 3 is a plan view of a second component comprising a housing containing a capacitor cell.

As shown in FIG. 3, also in the case in which the leads 18 and 19 of a capacitor cell 20 are not symmetrical with respect to the cell resilient clamping members 14, 15, 16, 17 ensure that leads 18, 19 are centered on two sides with respect to a housing 30. In this case the position of cell 20 is certainly not symmetrical with respect to the walls of the housing 30.

By rounding off the resilient clamping members on their sides facing the open side 12 of the housing 1 (see the resilient clamping members 5 and 7 in FIG. 2) a self-locating system for the wires of the capacitor cell is realized: the resilient clamping members of each pair have profiles which have a centering effect.

The housing 1 and the resilient clamping members 4, 5, 6 and 7 may be integrally moulded from a synthetic resin.

What is claimed is:

1. An electrical component comprising an electric circuit element encapsulated in an electrically insulating material which secures the circuit element in a housing which is open on one side, said circuit element having two external mutually parallel leads which are parallel to the end faces of the circuit element, characterized in that two pairs of resilient clamping members extend from opposite inside longitudinal walls of the housing, and the clamping members of each pair converge and clamp one external lead of the circuit element between the ends of the clamping members of that pair.

2. An electrical component as claimed in claim 1, characterized in that the clamping members of each pair extend one from each of the opposite inside longitudinal walls of the housing.

3. An electrical component as claimed in claim 1 or 2, characterized in that each pair of resilient clamping members have profiles which has a centering effect.

4. An electrical component as claimed in any one of claims 1 to 2 characterized in that the housing and the resilient clamping members are integrally moulded from a synthetic resin.

* * * * *